(12) United States Patent
Mirth

(10) Patent No.: US 7,056,824 B2
(45) Date of Patent: Jun. 6, 2006

(54) ELECTRONIC DEVICE MANUFACTURE

(75) Inventor: George P. Mirth, Saratoga, CA (US)

(73) Assignee: Shipley Company, L.L.C., Marlborough, MA (US)

( * ) Notice: Subject to any disclaimer, the term of this patent is extended or adjusted under 35 U.S.C. 154(b) by 6 days.

(21) Appl. No.: 10/742,424

(22) Filed: Dec. 19, 2003

(65) Prior Publication Data

US 2004/0224528 A1   Nov. 11, 2004

Related U.S. Application Data

(60) Provisional application No. 60/435,975, filed on Dec. 20, 2002.

(51) Int. Cl.
*H01L 21/4763* (2006.01)

(52) U.S. Cl. .................. 438/623; 438/670; 438/725

(58) Field of Classification Search ............. 438/623, 438/636, 637, 670, 671, 725; 257/750, 760
See application file for complete search history.

(56) References Cited

U.S. PATENT DOCUMENTS

| | | | |
|---|---|---|---|
| 4,246,374 A | 1/1981 | Kopchik | |
| 4,451,971 A | 6/1984 | Milgram | |
| 4,524,121 A | 6/1985 | Gleim et al. | |
| 4,636,532 A | 1/1987 | Sandford | |
| 5,556,812 A * | 9/1996 | Leuschner et al. | 438/623 |
| 5,654,376 A | 8/1997 | Knors et al. | |
| 5,944,975 A | 8/1999 | Wilson et al. | |
| 6,352,909 B1 | 3/2002 | Usenko | |
| 6,365,263 B1 * | 4/2002 | Chang | 428/195.1 |
| 6,798,003 B1 * | 9/2004 | Li et al. | 257/295 |
| 6,800,551 B1 * | 10/2004 | Nagahara et al. | 438/638 |
| 6,805,139 B1 * | 10/2004 | Savas et al. | 134/1.3 |
| 6,878,500 B1 | 4/2005 | Rutter, Jr. et al. | |

FOREIGN PATENT DOCUMENTS

WO   WO 02/43071 A1   5/2002

* cited by examiner

*Primary Examiner*—Hsien-Ming Lee
(74) *Attorney, Agent, or Firm*—S. Matthew Cairns

(57) ABSTRACT

A method of manufacturing electronic devices containing one or more layers of materials that are sensitive to the strong chemicals used to remove cross-linked polymeric layers such as photoresists and antireflective coatings is provided. The cross-linked polymeric layers can be easily removed following etching through the use of certain removable layers disposed between the substrate and the cross-linked polymeric layers.

15 Claims, 1 Drawing Sheet

ELECTRONIC DEVICE MANUFACTURE

This application claims the benefit of provisional application Ser. No. 60/435,975, filed on Dec. 20, 2002.

BACKGROUND OF THE INVENTION

The present invention relates generally to the field of manufacturing electronic devices. In particular, the present invention relates to the field of electronic devices containing low dielectric constant materials or ferroelectric polymers.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components.

One method for reducing the dielectric constant of interlayer insulating material is to use certain organic materials as the insulating material. Another method is to incorporate within the insulating film very small, uniformly dispersed pores or voids, particularly within inorganic dielectric materials. Such porous dielectric materials have a reduced, and possibly substantially reduced, dielectric constant as compared to the same dielectric materials without the presence of pores.

A variety of organic and inorganic dielectric materials are known in the art in the manufacture of electronic devices, particularly integrated circuits. Suitable organic dielectric materials include thermosets such as polyimides, polyarylene ethers, polyarylenes, polycyanurates, polybenzazoles, benzocyclobutenes and the like. Suitable inorganic dielectric materials include silicon dioxide and organo polysilicas, among others.

In general, porous dielectric materials are prepared by first incorporating a removable porogen into a dielectric material, disposing the dielectric material containing the removable porogen onto a substrate, curing the dielectric material and then removing the polymer to form a porous dielectric material. For example, U.S. Pat. No. 6,271,273 (You et al.) discloses a process for forming an integrated circuit device containing porous organo polysilica dielectric material. U.S. Pat. No. 6,420,441 (Allen et al.) discloses a process for forming an integrated circuit containing porous organic or inorganic dielectric material.

Patterns are then typically etched in the porous or other low-dielectric constant ("low-k") dielectric material by applying a photoresist, optionally in conjunction with an antireflective coating, to the low-k dielectric material, and imaging the resist followed by etching, such as reactive-ion etching ("RIE"). Following such patterning, the photoresist and any optional antireflective coating is then removed. The photoresists and optional antireflective coatings used in such process typically are cross-linked polymeric coatings.

When etched, such as with RIE, such cross-linked polymeric coatings become difficult to remove. One reason for such difficulty in removing these post-etch polymeric coatings is the formation of organometallic species on the exposed portions of the photoresist and antireflective coatings and on the sidewalls of the features etched into the dielectric material. Very strong polymer removers, such as fluoride-containing removers, must typically be used to completely remove such post-etch photoresist and antireflective coating polymers. Such removers may cause problems. For example, such removers may damage the fragile low-k dielectric material or ferroelectric polymer layers. The remover, such as fluoride ion, may absorb into such low-k dielectric material or ferroelectric polymer layer and seep out of such layer at a subsequent time, such as during subsequent processing steps or even during use of the integrated circuit, which may cause shorts or other problems in the device. Milder methods of removing such post-etch polymeric coatings are needed to prevent such problems.

SUMMARY OF THE INVENTION

Post-etch organic polymer coatings, such as antireflective coatings and photoresists, can be readily removed according to the present invention without adversely affecting sensitive layers such as low-k dielectric materials and ferroelectric polymers. The present invention provides a method of manufacturing an integrated circuit device including the steps of: a) disposing one or more lift-off-layers on a substrate; b) disposing one or more layers of a polymeric coating on the lift-off layer; c) patterning the substrate; and d) removing the coating and lift-off-layers; wherein the substrate includes one or more layers of a ferroelectric polymer, a dielectric material or both, wherein the dielectric material has a dielectric constant $\leq 3$ and wherein the lift-off-layer is an organic polymeric material. Typically, the polymeric coating is a cross-linked polymer. The patterning step typically includes a reactive ion etching step.

Also provided by the present invention is an integrated circuit device including one or more layers of a ferroelectric polymer, a dielectric material having a dielectric constant $\leq 3$, or both, one or more lift-off-layers and one or more layers of polymeric coating on the lift-off layer, wherein the lift-off-layer is an organic polymeric material.

DETAILED DESCRIPTION OF THE INVENTION

Figure 1:
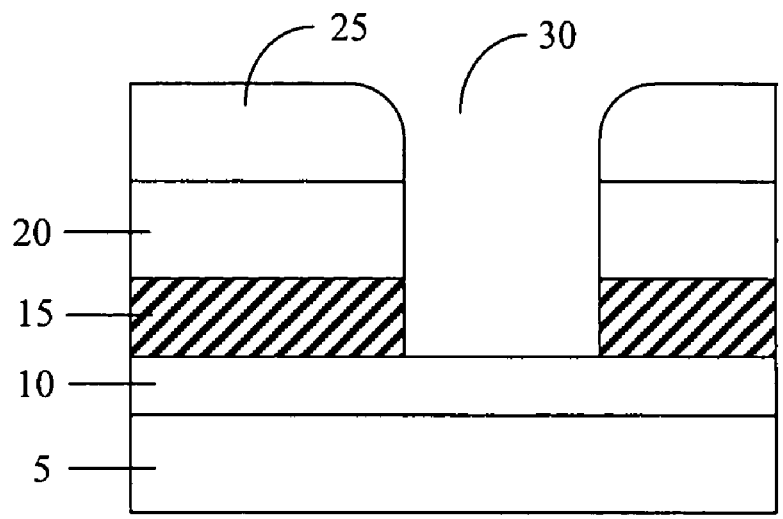
FIG. 1 illustrates an integrated circuit device containing a ferroelectric polymer and a lift-off-layer.

As used throughout this specification, the following abbreviations shall have the following meanings, unless the context clearly indicates otherwise: ° C.=degrees centigrade; nm=nanometer; g=gram; % wt=percent by weight; L=liter; μm=micron=micrometer; Å=angstrom; and rpm=revolutions per minute.

The term "(meth)acrylic" includes both acrylic and methacrylic and the term "(meth)acrylate" includes both acrylate and methacrylate. Likewise, the term "(meth)acrylamide" refers to both acrylamide and methacrylamide. The term "alkyl" includes straight chain, branched and cyclic alkyl groups. "Cross-linker" and "cross-linking agent" are used interchangeably throughout this specification. "Polymer" refers to polymers and oligomers, and also includes homopolymers and copolymers. The terms "oligomer" and "oligomeric" refer to dimers, trimers, tetramers and the like. "Monomer" refers to any ethylenically or acetylenically unsaturated compound capable of being polymerized or other compound capable of being polymerized by condensation. Such monomers may contain one or more double or triple bonds or groups capable of being polymerized by condensation. As used throughout the specification, "feature" refers to the geometries on a substrate. "Apertures" refer to recessed features, such as vias and trenches.

Unless otherwise noted, all amounts are percent by weight and all ratios are by weight. All numerical ranges are inclusive and combinable in any order, except where it is clear that such numerical ranges are constrained to add up to 100%.

Polymeric coatings, such as photoresists and antireflective coatings, are widely used in the manufacture of electronic devices, such as integrated circuits, micro electromechanical ("MEMS") devices, optoelectronic devices, semiconductor packaging, and the like. Typically, such polymeric coatings contain cross-linked polymers. Current integrated circuit designs contain certain layers, such as layers of low-k dielectric material and/or ferroelectric polymers, that are sensitive to certain strong chemicals used to remove polymeric coatings after etching, such as reactive ion etching. Polymeric coatings that have been subjected to etching conditions, and in particular reactive ion etching conditions, are referred to as "post-etch polymers" throughout this specification. The present invention provides easy removal of such post-etch polymers without the use of such strong chemicals. Accordingly, the present invention provides a method of manufacturing an integrated circuit device including the steps of: a) disposing one or more lift-off-layers on a substrate; b) disposing one or more layers of a polymeric coating on the lift-off layer; c) patterning the substrate; and d) removing the coating and lift-off-layers; wherein the substrate includes one or more layers of a ferroelectric polymer, a dielectric material or both, wherein the dielectric material has a dielectric constant $\leq 3$ and wherein the lift-off-layer is an organic polymeric material. Typically, the patterning step involves an ion etching step such as RIE.

A wide variety of organic polymeric material may be used as the lift-off-layer provided that such organic polymeric material layer is not cross-linked and, after baking, does not dissolve in the subsequently applied polymeric coating or in the solvent used to apply the polymeric coating. Typically, such organic polymeric material layer includes linear polymers or may include cross-linked polymer particles. When cross-linked polymer particles are used, it is the individual polymer particles that are cross-linked. In such cases, the lift-off-layer containing the individually cross-linked polymer particles is not itself cross-linked. Exemplary organic polymeric material useful as the present lift-off-layers include polyimides and polyamides, although other suitable polymers may be used. Polyimides are preferred. A wide variety of polyimides may be used such as, but not limited to, polyimides that are copolymers of an aromatic cycloaliphatic diamine and a dianhydride such as those disclosed in U.S. Pat. No. 4,451,971 (Milgram), polyglutarimide, and the like. Preferably, the lift-off-layer is a polyglutarimide.

Suitable polyglutarimide polymers are generally commercially available or may be prepared by a variety of means known in the literature. For example, polyglutarimide can be prepared by the method disclosed in U.S. Pat. No. 4,246,374 (Kopchik). In this method, a (meth)acrylic polymer, such as poly(methyl methacrylate) or poly(methyl acrylate), is reacted with ammonia or a primary amine. Such reaction is typically performed under pressurized conditions with heating. It will be appreciated by those skilled in the art the polyglutarimide may be prepared by a variety of other methods. In general, polyglutarimides may have from 1 to 99% imidization. Typically, the polyglutarimides have from 10 to 95% imidization, and specifically from 20 to 95% imidization.

The organic polymeric material suitable for use as a lift-off-layer may have a wide range of molecular weights. In general, such material has a weight average molecular weight of up to 250,000. Typically, the weight average molecular weight is up to 150,000. When polyglutarimide is used, the molecular weight is typically up to 150,000 and more typically up to 50,000. Such polyglutarimides can be prepared according to the method disclosed in U.S. Pat. No. 4,636,532 (Sandford), or by other suitable methods.

A lift-off-layer is typically formed by disposing a lift-off-layer coating composition including one or more organic polymeric materials and an organic solvent on a substrate. The organic polymeric material is typically present in such compositions in an amount of $\leq 30\%$ wt based on the weight of the composition, and more typically in the range of 5 to 30% wt. Specifically, the organic polymeric material is present in an amount of $\leq 15\%$ wt and more specifically $\leq 10\%$ wt. Suitable organic solvents include, without limitation, cyclic ketones such as cyclopentanone and cyclohexanone; polar aprotic amides such as dimethylformamide, dimethylacetamide, N-methylpyrrolidone and dimethylpropyleneurea; alcohols such as cellosolve acetate, tetrahydrofurfuryl alcohol, acetol, methyl carbitol, and 2-methoxyethanol; small carboxylic acids such as formic acid and acetic acid; basic ethers such as N-alkylmorpholines such as; cyclic ethers such as tetrohydrofuran, 1,3-dioxolane and 1,4-dioxane; and the like. It will be appreciated by those skilled in the art that mixtures of organic solvents may suitably be used. Other solvents which are not solvents for the organic polymeric materials themselves may be combined with the above described solvents to provide a solvent system suitable for the lift-off-layer forming compositions.

Such lift-off-layer composition may be disposed on the substrate by a variety of means including, without limitation, spin coating, roller coating, curtain coating, brushing, dipping and the like. Spin coating is a particularly suitable method of disposing the composition on the substrate. Suitable spin speeds are from 1000 to 7000 rpm and are typically from 2500 to 7000. The thickness of the lift-off-layer may vary over a wide range, but is generally $\leq 10,000$ Å. Typically, the lift-off-layer thickness is $\leq 5000$ Å, specifically $\leq 3000$ Å, and more specifically $\leq 2500$ Å. In general, the thickness of the lift-off-layer can be controlled, in part, by the spin speed. For example, a 1000 Å thick lift-off-layer can be obtained by spin coating a polyglutarimide composition at a rate of approximately 3000 rpm.

Although not required, the lift-off-layer compositions may further contain one or more additional components, such as, but not limited to, light-absorbing materials, surfactants, flow modifiers, and the like. Whether such additional components are present and in what amount are well within the ability of those skilled in the art.

Suitable substrates are any used in the manufacture of electronic devices such as, without limitation, integrated circuits, memory devices, MEMS devices, aemiconductor packaging, printed wiring boards, optoelectronic devices and the like. Preferably, the substrate is used in the manufacture of integrated circuits or memory devices. Typically, the substrate contains one or more layers sensitive to strong chemicals (such as fluoride ion, strong bases, and the like) used to strip or remove cross-linked polymeric layers, such as photoresists and antireflective coatings. By the term "strong base" it is meant bases that provide a solution pH of $\geq 10$ when added to water in a concentration of 5% by weight, such as such as choline, tetramethylammonium hydroxide, alkali metal hydroxides and the like. Exemplary layers that are sensitive to such strong chemicals are ferroelectric polymers and low-k dielectric materials. It will be appreciated that the substrate may contain one or more of any of these layers or combinations of any of these layers. As an example, the substrate may contain one or more ferroelectric polymer layers and one or more low-k dielectric material layers.

The substrate may contain any of a wide variety of ferroelectric polymers, such as those disclosed in International Patent Publication No. WO 02/43071 (Johansson et al.). Exemplary ferroelectric polymers include, without limitation, polyvinylidene fluoride, polyvinylidene fluoride copolymers such as copolymers with trifluoroethylene, polyvinylidene copolymers, odd-numbered nylons, copolymers with odd-numbered nylons, cynopolymers, copolymers with cynopolymers, and the like. When such ferroelectric polymers are used in memory devices, the layers of ferroelectric polymers typically have a thickness of $\leq 1$ µm. Ferroelectric thin films typically have a thickness in the range of 0.1 to 1 µm, while ferroelectric ultrathin films typically have a thickness of $\leq 0.1$ µm.

The substrate may also contain any of a variety of low-k dielectric materials. Such low-k dielectric materials typically have a dielectric constant of $\leq 3$. In particular, the low-k dielectric materials have a dielectric constant of $\leq 2.8$, specifically $\leq 2.5$, more specifically $\leq 2.2$, and still more specifically $\leq 2.0$. Such low-k dielectric materials may be organic or inorganic or an organic-inorganic hybrid. Exemplary low-k organic dielectric materials include, without limitation, polyarylenes, polyarylene ethers and bezocyclobutenes disclosed in WO 00/31183 (Bruza et al.), polyimides disclosed in U.S. Pat. No. 6,093,636 (Carter et al.) and U.S. Pat. No. 5,969,088 (Ezzell et al.), polycycloolefins, such as polynorbornene homopolymers and copolymers and polydicyclopentadiene homopolymers and copolymers, poly (aryl esters), poly(ether ketones), polycarbonates, polyaromatic hydrocarbons such as polynaphthalene, polyquinoxalines, poly(perfluorinated hydrocarbons) such as poly (tetrafluoroethylene), polybenzoxazoles, and the like. Other suitable low-k dielectric materials include spin-on-glass ("SOG") material or a spin-on-polymer ("SOP") material containing a light absorbing dye, such as those disclosed in U.S. Pat. Nos. 6,329,118 (Hussein et al.) and 6,365,529 (Hussein et al.).

In general, a wide variety of low-k inorganic dielectric materials may be used. Suitable low-k inorganic dielectric materials include porous inorganic dielectric materials. Exemplary porous inorganic dielectric materials include porous silica and porous organic polysilica. Particularly suitable organo polysilica (or organo siloxane) dielectric materials are those compounds containing silicon, carbon, oxygen and hydrogen atoms. Typically, the organic polysilica materials are polymers of condensates or hydrolyzates of the formula:

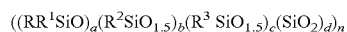

wherein R, $R^1$, $R^2$ and $R^3$ are independently selected from hydrogen, $(C_1-C_6)$alkyl, aryl, and substituted aryl; a, b, c and d are independently a number from 0 to 1; n is integer from about 3 to about 10,000; provided that a+b+c+d=1; and provided that at least one of R, $R^1$ and $R^2$ is not hydrogen. "Substituted aryl" refers to an aryl group having one or more of its hydrogens replaced by another substituent group, such as cyano, hydroxy, mercapto, halo, $(C_1-C_6)$alkyl, $(C_1-C_6)$ alkoxy, and the like. In the above formula, a, b and c represent the mole ratios of each component. Such mole ratios can be varied between 0 and about 1. Typically, a is from 0 to about 0.8. In general, b is from about 0.2 to about 1. In particular, c is from 0 to about 0.8. More typically, d is from 0 to about 0.8. In the above formula, n refers to the number of repeat units. For the condensates, n is typically an integer from about 3 to about 1000. It will be appreciated that prior to any curing step, the organo polysilica condensates may include one or more of hydroxyl or alkoxy end capping or side chain functional groups. Such end capping or side chain functional groups are known to those skilled in the art.

Suitable organo polysilica dielectric materials include, but are not limited to, silsesquioxanes, partially condensed halosilanes or alkoxysilanes such as partially condensed by controlled hydrolysis tetraethoxysilane having number average molecular weight of about 500 to about 20,000, organically modified silicates having the composition $RSiO_3$ or $R_2SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, butyl silsesquioxane and the like; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. It is preferred that the organo polysilica includes methyl silsesquioxane. Silsesquioxane materials include homopolymers of silsesquioxanes, copolymers of silsesquioxanes or mixtures thereof.

It will be appreciated that a mixture of dielectric materials may be used, such as two or more organic, two or more inorganic or a mixture of one or more organic and one or more inorganic dielectric materials. Thus, mixtures of alkyl/ aryl silsesquioxanes, hydrido/alkyl silsesquioxanes, two or more polyarylene ethers, two or more polyimides, and the like may be used. In one embodiment, suitable mixtures of dielectric materials include inorganic-organic hybrids, such as alkoxysilane/organic dielectric materials disclosed in European Patent Application No. EP 997 497 (Ioka et al.).

Such silica or organic polysilica dielectric materials may be made porous generally by the use of a porogen or pore forming material. Suitable porogens include solvents, polymers, and the like. Methods of forming porous low-k inorganic dielectric materials are disclosed in U.S. Pat. Nos. 5,895,263 (Carter et al.), 6,271,273 (You et al.) and 6,420, 441 (Allen et al.). Alternatively, the low-k organic dielectric material may be made porous, such as that disclosed in U.S. Pat. No. 6,093,636. The conditions for forming such porous low-k dielectric layers are well known to those skilled in the art. See, for example, U.S. Patent Application Publication No. 2002/0030297 (Gallagher et al.), and the patents cited above.

After being disposed on the substrate, the lift-off-layer coating composition is heated to remove any solvent (i.e. soft baked) and to provide a lift-off-layer on the substrate. One or more polymeric coatings, such as a photoresist or antireflective coating composition, are then typically disposed on the lift-off-layer by any conventional means. Typically, such polymeric coating is disposed on the lift-off-layer by spin coating. The polymeric coating composition is then heated to remove solvent. When the polymeric composition is an antireflective coating composition, it is next cured (cross-linked) prior to the disposition of any photoresist on the antireflective coating. Such curing step may be performed by any suitable means, such as heating, irradiation or a combination of heating and irradiation. In one embodiment, one or more layers of a photoresist composition are disposed on the lift-off-layer. In another embodiment, one or more layers of an antireflective coating are disposed on the lift-off-layer and then one or more layers of a photoresist are then disposed on the antireflective coating layer(s).

A wide variety of photoresists may suitably be used, including both positive acting and negative acting resists. Suitable photoresists are those available from Shipley Company, Marlborough, Mass. A wide variety of antireflective coatings may be used in the present invention, including those sold by Shipley under the trademarks AR3, AR5 and AR7. Other suitable antireflective coatings are those available from Brewer Science, Inc., Rolla, Mo.

Next, the photoresist layer is imaged through a mask using actinic radiation. The choice of radiation used will depend upon the particular photoresist selected and is well within the ability of one skilled in the art. After imaging, the photoresist layer is developed to form a pattern. The pattern is then transferred into the underlying layers, such as by etching such as reactive ion etching. Such etching produces apertures in the underlying layers. Additionally, such etching results in the formation of post-etch polymers, which contain, among other things, certain organometallic species.

Figure 2:
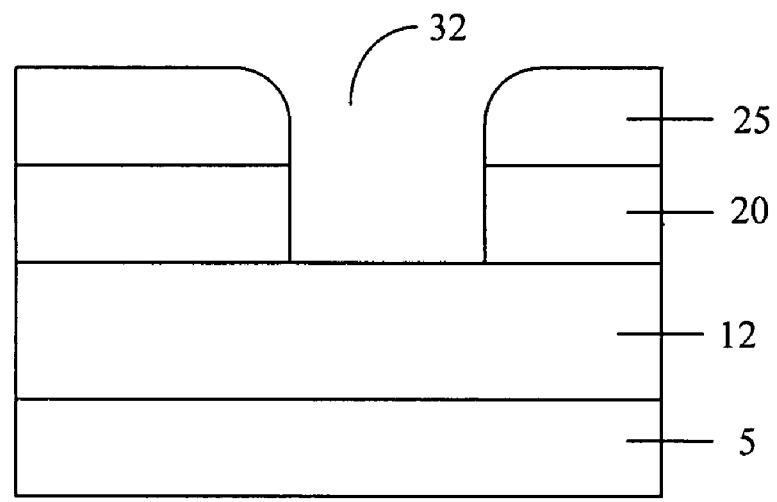
FIG. 2 illustrates an integrated circuit device containing a low-k dielectric material and a lift-off-layer.

FIG. 1 illustrates an integrated circuit device containing in order, a substrate 5, a ferroelectric polymer layer 10, a metal layer 15, lift-off-layer 20 and a photoresist layer 25. The structure has been patterned (etched), such as by RIE, to provide aperture 30. FIG. 2 illustrates an integrated circuit device containing in order, a substrate 5, a low-k dielectric material 12, a lift-off-layer 20 and a photoresist layer 25. The structure has been patterned (etched), such as by RIE, to provide aperture 32.

Following pattern transfer, the photoresist and any antireflective coating are removed. An advantage of the present lift-off-layer is that mild removal conditions may be employed to remove such cross-linked photoresists, antireflective coatings or a combination of these. To remove the post-etch coatings, the substrate is contacted with one or more solvents. The solvents may be used alone or in a composition further including one or more acids or one or more bases. Any of the solvents described above used to prepare the lift-off-layer coating compositions are suitable for removing the lift-off-layer. Particularly useful solvents for removing the lift-off-layer are cyclic ketones such as cyclopentanone and cyclohexanone. Suitable bases include aqueous alkali such as aqueous alkali metal hydroxides, tetraalkylammonium hydroxides such as tetramethylammonium hydroxide, as well as other amines. While not wishing to be bound by theory, as the solvent removes the lift-off-layer, the post-etch polymer layers overlying the lift-off-layer are also removed. Thus, another advantage of the present invention is that post-etch polymers, that can typically only be removed using strong chemicals such as fluoride ion, strong bases and the like, can be easily and completely removed according to the present invention. Following such removal of the lift-off-layer, the substrate is optionally rinsed, such as with water or organic solvent and optionally dried, prior to further processing.

A further advantage of the present invention is that conventional strong base removers, such as those containing fluoride ion, having a pH$\geq$10, and the like, can still be used to remove the lift-off-layers. The ease of removal of the lift-off-layers allows removal of the post-etch polymers by contacting the post-etch polymer with conventional strong base removers for shorter periods of time or at lower concentrations or at lower temperatures or any combination of these than would be required to remove such post-etch polymers in the absence of a lift-off-layer. Such reduced contact times, reduced temperatures and lower strong base concentrations provides removal of the post-etch polymers with reduced or eliminated damage to the sensitive material layers, such as low-k dielectric materials and ferroelectric polymers.

Accordingly, the present invention also provides an integrated circuit device comprising one or more layers of a ferroelectric polymer, a dielectric material having a dielectric constant $\leq$3 or both, one or more lift-off-layers and one or more layers of a polymeric coating on the lift-off layer, wherein the lift-off-layer is an organic polymeric material. Typically, the polymeric coating is a cross-linked coating. More typically, the polymeric coating is a post-etch polymer.

The following examples are presented to illustrate further various aspects of the present invention, but are not intended to limit the scope of the invention in any aspect.

EXAMPLE 1

A lift-off-layer coating composition is prepared by combining polyglutarimide (weight average molecular weight of $\leq$50,000) with cyclopentanone in an amount to provide 3–7% solids.

The lift-off-layer coating composition is spin coated on a substrate used in the manufacture of an integrated circuit and containing a ferroelectric polymer layer. The spin speed is 3000 rpm and the lift-off-layer has a thickness of approximately 1000 Å. The substrate is then baked to remove the solvent. Once the solvent is removed, a photoresist (such as those marketed by Shipley Company, Marlborough, Mass.) is deposited (such as by spin-coating) on the lift-off-layer. The photoresist is then soft baked to remove the solvent and then further cured as necessary. The photoresist is then exposed through a mask to radiation, such as light of appropriate wavelength or e-beam, to provide an image. Following exposure, the photoresist is developed using a suitable developer (such as those available from Shipley Company, and then the substrate is patterned by transferring the image into the substrate with a suitable transfer technique such as reactive ion etching. Such etching creates apertures in layers on the substrate. Following such etching, the photoresist is completely removed by contacting the substrate with a solvent (such as cyclopentanone) as the remover. The cyclopentanone removes the lift-off-layer, and as a result, the photoresist layer overlying the lift-off-layer.

EXAMPLE 2

The procedure of Example 1 is repeated except that the substrate contains a layer of a porous organic polysilica dielectric material (low-k dielectric material) and that the remover is tetrahydrofurfuryl alcohol.

EXAMPLE 3

The procedure of Example 1 is repeated except that the substrate contains two layers of a porous organic polysilica dielectric material (low-k dielectric material) and a layer of a ferroelectric polymer and that the remover is cyclohexanone.

EXAMPLE 4

The procedure of Example 2 is repeated except that an antireflective coating (such as AR7 available from Shipley) is disposed on lift-off-layer, and then cured. After curing of the antireflective layer, the photoresist is disposed on the cured antireflective layer and the procedure of Example 2 is followed.

EXAMPLE 5

A lift-off-layer coating composition is prepared by combining polyglutarimide (weight average molecular weight of $\leq 50,000$) with cyclopentanone in an amount to provide 3–7% solids.

The lift-off-layer coating composition is spin coated on a number of wafers. The spin speed is 3000 rpm and the lift-off-layer ("LOL") has a thickness of approximately 1750 Å. The wafers are then baked to remove the solvent. One set of wafers (Set A) is baked at 120° C. on a hot plate for 10 minutes. Another set of wafers (Set B) is baked at 120° C. on a hot plate for 30 minutes. Samples from both sets of wafers are then subjected to various removers at 23° C. and the time to remove the lift-off-layer is determined. These results are reported in the Table.

A ferroelectric polymer layer is deposited on a number of wafers (Set C) that do not contain a lift-off-layer. These wafers are then contacted with the various removers listed in the Table for 3 minutes are 23° C. and the amount of the ferroelectric polymer removed is determined.

TABLE

| Remover | Wafer Set A Time to Remove LOL (sec) | Wafer Set B Time to Remove LOL (sec) | Thickness of Ferroelectric Polymer Layer Removed (Å) |
|---|---|---|---|
| A | <10 | <10 | <2 |
| B | 10–20 | 10–20 | <5 |
| C | <10 | <10 | <1 |
| D | 30 | 50 | <1 |
| E | 15 | 20 | Layer lifted |
| F | 15 | 15 | Layer lifted |
| G | 20 | 20 | <2 |

Remover A is a commercially available tetramethylammonium hydroxide based developer that does not contain surfactant but is capable of etching aluminum. Remover B is a metasilicate based developer that minimizes attack to aluminum. Remover C is an amine based polymer stripper containing inhibitors to both copper and aluminum attack. Remover D is cyclopentanone. Remover E is a commercially available solvent blend polymer stripper that is pH neutral. Remover F is a commercially available alkaline N-methylpyrrolidone based polymer stripper. Remover G is a combination of an amine and a glycol ether that is capable of etching aluminum. From the above data, it can clearly be seen that removers A–D and G can remove the LOL without affecting the ferroelectric polymer layer. In contrast, the commercially available polymer strippers (Removers E and F) not only remove the LOL but also remove the ferroelectric polymer layer.

What is claimed is:

1. A method of manufacturing an integrated circuit device including the steps of: a) disposing one or more lift-off-layers on a substrate; b) disposing one or more layers of a cross-linked coating on the lift-off layer; c) patterning the substrate; and d) removing the cross-linked coating and lift-off-layers by contacting the one or more lift-off layers with a solvent; wherein the substrate includes one or more layers of a ferroelectric polymer, a dielectric material or both, wherein the dielectric material has a dielectric constant $\leq 3$ and wherein the lift-off-layer is an organic polymeric material and comprises a light-absorbing material.

2. The method of claim 1 wherein the lift-off-layer comprises a polyglutarimide.

3. The method of claim 2 wherein the polyglutarimide has a molecular weight of $\leq 50,000$.

4. The method of claim 1 wherein the lift-off-layer comprises cross-linked polymeric particles.

5. The method of claim 1 wherein the dielectric material has a dielectric constant of $\leq 2.8$.

6. The method of claim 1 wherein the dielectric material has a dielectric constant of $\leq 2.5$.

7. The method of claim 1 wherein the solvent is selected from the group consisting of aprotic amides, cyclic ketones, alcohols, basic ethers, and cyclic ethers.

8. The method of claim 1 wherein the lift-off-layer has a thickness of $\leq 2500$ Å.

9. The method of claim 1 wherein the cross-linked coating is a photoresist or an antireflective coating.

10. The method of claim 1 wherein the cross-linked coating comprises one or more layers of an antireflective coating and one or more layers of a photoresist.

11. An integrated circuit device comprising one or more layers of a ferroelectric polymer, one or more liftoff-layers and one or more layers of a cross-linked coating on the lift-off layer, wherein the lift-off-layer is an organic polymeric material selected from a group consisting of polyimide and polyamide.

12. The integrated circuit device of claim 11 further comprising a dielectric material having a dielectric constant $\leq 3$.

13. A method of manufacturing an integrated circuit device including the steps of: a) disposing one or more lift-off-layers on a substrate; b) disposing one or more layers of a cross-linked coating on the lift-off layes; c) patterning the substrate; and d) removing the cross-linked coating and lift-off-layers by contacting the one or more lift-off layers with a solvent; wherein the substrate includes one or more layers of a ferron electric polymer, and wherein the lift-off-layer is an organic polymeric material.

14. The method of claim 1 wherein the lift-off layer is selected from a group consisting of polyimide and polyamide.

15. The method of claim 1 wherein the solvent comprises one or more bases.

* * * * *